EPITAXIAL GROWTH OF GERMANIUM

Filed April 24, 1967

INVENTORS
Don M. Jackson, Jr.
Robert W. Howard

BY

Mueller, Aichele & Rauner

ATTY'S.

3,473,978
EPITAXIAL GROWTH OF GERMANIUM

Don M. Jackson, Jr., Scottsdale, and Robert W. Howard, Phoenix, Ariz., assignors to Motorola, Inc., Franklin Park, Ill., a corporation of Illinois Filed Apr. 24, 1967, Ser. No. 633,127
Int. Cl. H01l 7/36; C23c 11/02
U.S. Cl. 148—175 8 Claims

ABSTRACT OF THE DISCLOSURE

A uniformly monocrystalline germanium layer is deposited on a silicon substrate by a process involving the initial growth of an epitaxial silicon layer to form a perfect surface for the subsequent growth of germanium. The epitaxial silicon wafer is then cooled to a temperature below 670° C., followed by the nucleation and growth of germanium. Germane ($GeH_4$) is the only compound found suitable as a source of germanium for the initial nucleation of the monocrystalline germanium film. After an initial germanium growth of at least 0.2 micron, subsequent growth is carried out using previously known technology, which includes the use of temperatures above 670° C., and the use of germanium tetrachloride, trichlorogermane or other germanium compounds as a source of germanium.

BACKGROUND

This invention relates generally to the processing of semiconductive materials, and to the fabrication of semiconductor structures for use in the assembly of transistors, rectifiers, integrated circuits, and other semiconductor devices. A method is provided for the epitaxial growth of monocrystalline germanium on silicon substrates.

Previous efforts to grow monocrystalline germanium on silicon, using known techniques for the epitaxial growth of germanium on germanium, have met with very limited success. The resulting films have not been uniformly monocrystalline and generally have a poor structural quality. Vacuum deposition techniques have shown somewhat greater promise than systems involving the use of atmospheric pressure and a flowing stream of decomposable germanium compound, the latter approach being commercially more attractive, if successful.

A commercially successful process for the epitaxial growth of germanium on silicon is desirable as a means of increasing the compatibility of germanium and silicon technologies. For example, monolithic integrated circuits containing germanium and silicon devices on a single semiconductor die become practical.

The cost of germanium devices in general would be substantially reduced, since silicon is cheaper than germanium, and as a substrate material silicon would form a predominant portion of the "bulk" of germanium semiconductor structures. An epitaxial wafer consisting of germanium on silicon can be HCl etched at high temperatures in accordance with existing technology to fabricate germanium planar transistors, for example, and germanium field-effect devices.

THE INVENTION

Accordingly, it is an object of the present invention to grow monocrystalline germanium on silicon substrates. It is a further object of the invention to make the fabrication of germanium devices more compatible with existing silicon technology.

It is a feature of the invention to provide an initial layer of epitaxial silicon on a silicon substrate prior to germanium growth. The epitaxial silicon has been found more nearly ideal as a base to support the nucleation and growth of monocrystalline germanium.

It is another feature of the invention to initiate the nucleation and growth of germanium at temperatures well below the temperature range generally accepted heretofore as being ideal for germanium growth. Once the initial nucleation of monocrystalline germanium has formed a layer at least 0.2 micron thick, a continued growth of germanium is carried out at higher temperatures to obtain increased growth rates without sacrificing the uniform monocrystalline quality of the epitaxial layer.

It is also critical that the initial nucleation of germanium be carried out using germane ($GeH_4$) as a source of germanium.

The invention is embodied in a method for the nucleation and growth of monocrystalline germanium on a silicon substrate which comprises epitaxially growing a layer of monocrystalline silicon at least 0.1 micron thick on said substrate at a temperature of at least 900° C., then cooling the silicon below 670° C. for the initiation of germanium growth, then passing a germane-comprising gas in contact with the newly formed epitaxial silicon surface at a temperature within the range 350° C. to 670° C. for a sufficient time to grow at least 0.2 micron of epitaxial germanium, then raising the substrate tempearture above 670° C. and containing the epitaxial growth of germanium.

In accordance with a preferred embodiment of the invention a silicon substrate is selected having a crystallographic orientation such as to provide a (111) plane for epitaxial growth. Preferably, the orientation is from 2 to 4 degrees off (111) toward the (110) plane. A (310) plane is also suitable. The selected surface of the substrate is then cleaned and polished by HCl etch in accordance with known procedures. For example, the substrate is heated to 1200° C. and exposed to the flow of a gas mixture comprising 1 to 5 percent hydrogen chloride in hydrogen.

The epitaxial growth of silicon is then commenced, also in accordance with known procedures. For example, the cleaned and polished wafer is maintained at a temperature of 1100° C. and exposed to a gaseous stream containing hydrogen and silicon tetrachloride in a ratio of 800 to 1 by volume. Growth of as little as 0.1 micron of epitaxial silicon is frequently sufficient to provide a suitable surface for the subsequent growth of epitaxial germanium. It may, however, be necessary or desirable sometimes to grow more than 0.1 micron of silicon prior to the germanium.

The wafer temperature is then reduced below 670° C. (350° C. to 670° C.). At this temperature the wafer is exposed to a gaseous flow of germane ($GeH_4$) in hydrogen as a carrier gas and diluent. The ratio of hydrogen to germane is within the range of 500 to 15,000 parts hydrogen per volume of germane. Other carrier gases may be used, including helium or nitrogen, although not necessarily with equivalent results. Preferably, the flow rate of the germane is increased slowly from zero to approximately 2 to 3 cc. per minute, and is continued for a time sufficient to grow at least 0.2 micron of epitaxial germanium. Thereafter, previously known conditions are suitable, including particularly temperatures above 670° C. and the use of germanium sources other than $GeH_4$, including $GeCl_4$ or $GeHCl_3$.

The temperatures are determined by direct optical pyrometer or infra-red pyrometer readings and are not corrected for either emissivity or quartz window absorption.

DRAWINGS

Figure 1:
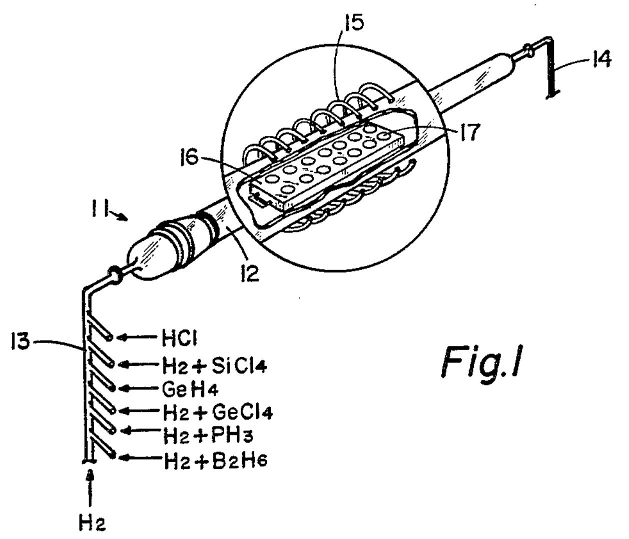
FIG. 1 is a diagrammatic representation of a suitable system for the production of epitaxial films in accordance with the invention.

In FIGURE 1 epitaxial furnace system 11 consists of quartz tube 12 equipped with inlet line 13, outlet line 14, and RF induction coils 15 for maintaining graphite susceptor 16 and silicon wafers 17 at a suitable elevated temperature.

Figure 2:
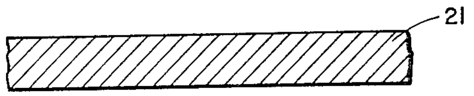
FIGURES 2, 3 and 4 are enlarged cross-sectional views of a semiconductor wafer, illustrating a sequence of processing steps carried out in accordance with the present invention.
Figure 3:
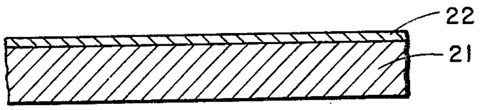
Figure 4:
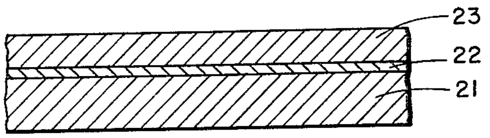

FIGURE 2 shows a monocrystalline silicon wafer 21 to be processed in accordance with the invention. FIGURE 3 shows wafer 21 of FIGURE 2 after the growth of a thin epitaxial layer 22 of silicon. FIGURE 4 is an enlarged cross-sectional view of the wafer shown in FIGURE 3 after the growth of an epitaxial layer of germanium 23 in accordance with the present invention.

EXAMPLE

A monocrystalline silicon wafer having a crystallographic orientation 2° off (111) toward (110) was subjected first to a 10-minute HCl etch at 1200° C. and was then cooled to 1050° C. A thin layer of epitaxial silicon was grown on the etched surface at 1050° C. using $SiH_4$ as a source and using conventional conditions, for a growth time of 5 min. The wafer was then cooled to 600° C. for initial germanium growth. The germane flow rate was held at 2.74 cc./min. and the $H_2$ carrier at 40 liters/min. for a growth time of 10 minutes. The temperature was then raised to 700° C. and the germane flow was held at 4.84 cc./min. for an additional growth time of 10 minutes. The resulting epitaxial germanium layer was uniformly monocrystalline as shown by its highly reflective mirror finish.

Additional runs were carried out in an attempt to produce high-quality epitaxial germanium on silicon without observing all the conditions found to be essential in accordance with the invention. The process conditions used and the results obtained are summarized as Runs 1–4 in the following table. Run 5 is the illustrative example reported in detail above.

| Run | Epi Si First | $GeH_4$ Source | Start Ge Growth Below 670° C. | Crystal Orientation | Results |
|---|---|---|---|---|---|
| 1 | No | Yes | Yes | 2° off (111) | Poor. |
| 2 | No | Yes | Yes | (100) | Very poor. |
| 3 | No | Yes | No | 2° off (111) | Poor. |
| 4 | Yes | Yes | No | 2° off (111) | Do. |
| 5 | Yes | Yes | Yes | 2° off (111) | Very good. |

Run 1 was essentially the same as Run 5 except for the omission of the step of growing epitaxial silicon as a base for the germanium. Run 2 was identical with Run 1 except for the use of a (100) silicon substrate. Run 3 was essentially the same as Run 1 except for the step of initiating germanium growth at 700° C. Run 4 was the same as Run 5 except for initiating Ge growth at 700° C. The only acceptable result was obtained in Run 5, carried out in accordance with the invention.

What is claimed is:

1. A method for the nucleation and growth of monocrystalline germanium on a silicon substrate which comprises epitaxially growing a layer of monocrystalline silicon at least 0.1 micron thick on said substrate at a temperature of at least 900° C., then cooling the silicon below 670° C. for the initiation of germanium growth, then passing a gas comprising germane and a carrier in contact with the newly formed epitaxial silicon surface at a temperature within the range 350° C. to 670° C. for a time sufficient to grow at least 0.2 micron of epitaxial germanium, then raising the substrate temperature above 670° C. and continuing the expitaxial growth of germanium.

2. A method as defined by claim 1 wherein said germane-comprising gas consists essentially of hydrogen and germane in a ratio of at least 500 parts by volume of hydrogen to each volume of germane.

3. A method as defined by claim 1 wherein the flow rate of said germane is increased gradually from 0 to at least 2 cc. per minute for the initial nucleation of germanium.

4. A method as defined by claim 1 wherein the conformed epitaxial surface a germanium compound selected tinued growth of germanium at a temperature above 670° C. is carried out by passing in contact with the newly from the group consisting of germane, trichlorogermane and germanium tetrachloride.

5. A method as defined by claim 1 wherein the crystallographic orientation of the silicon substrate is from 2° to 4° off (111) toward (110).

6. A method as defined by claim 1 wherein said substrate is cleaned by etching with HCl prior to the step of epitaxially growing a layer of monocrystalline silicon thereon.

7. A method as defined by claim 1 wherein the crystallographic orientation of the silicon substrate is from (111) to 6° off (111) toward (110), and further including the steps of polishing said silicon substrate with HCl prior to the step of epitaxially growing a layer of monocrystalline silicon thereon, and then gradually increasing the flow rate of said germane gas from 0 to at least 2 cc. per minute for the initial nucleation of germanium.

8. A method as defined by claim 1 wherein the crystallographic orientation of the substrate is (310).

References Cited

UNITED STATES PATENTS 3,341,376 9/1967 Spenke et al. 148—175

L. DEWAYNE RUTLEDGE, Primary Examiner

P. WEINSTEIN, Assistant Examiner

U.S. Cl. X.R.

117—106, 107.2, 201